United States Patent [19]

Blocher, Jr. et al.

[11] 4,380,556
[45] Apr. 19, 1983

[54] VAPOR DEPOSITION OF HARDENED NIOBIUM

[75] Inventors: John M. Blocher, Jr.; Neil D. Veigel; Richard B. Landrigan, all of Columbus, Ohio

[73] Assignee: The United States of America as represented by the United States Department of Energy, Washington, D.C.

[21] Appl. No.: 335,696

[22] Filed: Jan. 3, 1964

[51] Int. Cl.³ .......................... G21C 3/06; B05D 7/00; B05C 19/02
[52] U.S. Cl. ........................................ 427/6; 118/712; 118/DIG. 5; 427/213
[58] Field of Search .................. 117/107, 107.2; 427/6, 427/213; 118/712, DIG. 5

[56] References Cited

U.S. PATENT DOCUMENTS 2,901,381  8/1959  Teal ................................ 427/226 X

OTHER PUBLICATIONS

Euraec-309 AEC Document, "Study of the Coating of Ceramic Uraniferous Particles by Means of Metallic Niobium", Apr. 1962, pp. 1–10, (Abstracted in vol. 17, No. 18, p. 1638 of Nuclear Science Abstracts).
Euraec-409 AEC Document, "Coating of Uraniferous Ceramic Particles with Niobium Metal", Jul. 1962, pp. 1–10, (Abstracted in vol. 17, No. 18, p. 1445 of Nuclear Science Abstracts).

Primary Examiner—Richard D. Lovering

[57] ABSTRACT

A method of coating ceramic nuclear fuel particles containing a major amount of an actinide ceramic in which the particles are placed in a fluidized bed maintained at ca. 800° to ca. 900° C., and niobium pentachloride vapor and carbon tetrachloride vapor are led into the bed, whereby niobium metal is deposited on the particles and carbon is deposited interstitially within the niobium. Coating apparatus used in the method is also disclosed.

10 Claims, 4 Drawing Figures

□ Calculated feed rate based on vapor-pressure data and 100% saturation of carrier-gas @ 0°C.
△ Measured weight of CCl₄ vaporized @ 0°C during the coating runs.
○ Measured weight of CCl₄ vaporized @ -72°C during the coating runs.

VAPOR DEPOSITION OF HARDENED NIOBIUM

The invention relates to a novel method of coating ceramic nuclear fuel and fertile particles with hardened niobium by vapor deposition, more particularly to such deposition within a fluidized bed, to an apparatus for carrying it out, and to the product produced thereby.

Individually coated fuel and fertile particles have been the subject of extensive investigation in the nuclear reactor field because of the geometrical advantage inherent in their small size for fission product containment. Of the various coatings which have been tried metallic niobium has shown promise because of its favorable nuclear properties, mechanical strength, chemical inertness, and ease of application to the particles. A general account of the methods used to coat fuel and fertile particles with this metal, and its alloys, is to be found in the report known as BMI-1440, available from the Office of Technical Services, United States Department of Commerce, Washington 25, D.C.

However, niobium coated particles made according to previous methods have not been found to be entirely satisfactory. One of their main shortcomings is a lack of hardness, which makes them subject to the kinds of deformation known as stringering and tailing when the particles are compressed into a matrix. This results in weakness of the coatings which, in turn, permits leakage of fission products, particularly those of a gaseous character, and it also permits coolant or moderator fluids to come into contact with the fuel or fertile material, which is undesirable for several reasons.

It is, accordingly, the general object of the invention to provide a method of deposition on ceramic fuel and fertile particles of coatings of niobium having improved hardness and resistance to deformation.

It is another object of the invention to provide a method of controlling such a deposition with respect to urania dust and other such impurities.

It is a more particular object to provide an apparatus for carrying out the method of depositing referred to.

It is a further object to provide niobium coated fuel and fertile particles with an improved degree of hardness and resistance to mechanical deformation.

Other objects will appear as the description proceeds.

According to the invention fuel or fertile particles are coated with niobium in a fluidized bed by the thermal decomposition of gaseous niobium pentachloride within the bed, along with the pressure of a decomposable carboniferous gas which deposits carbon interstitially in the niobium, thereby imparting to it increased hardness. A relationship exists between hardness and the amount of carbon thus deposited interstitially, which appears to be exponential in character.

We have found that not all decomposable gases containing carbon may be used efficiently for this purpose. Methane and benzene, for example, can be deposited with niobium with only 4 percent or less efficiency. However, carbon tetrachloride is about 65 percent efficient, and thus appears to be uniquely suited to carrying out our invention. We have a method of controlling the rate of flow of carbon tetrachloride by varying the rate of flow of hydrogen through a vaporizer which we have devised.

Finally, we have found a method of controlling urania dust and other such contamination of the hardened niobium coatings, which contemplates application of coatings in two steps, the second step being made with the addition of magnetically separable control spheres to the fluidized bed, whereby impurities may be monitored. This will be explained in more detail later on.

BRIEF DESCRIPTION OF DRAWINGS

Attention is now directed to the drawings,

Referring to FIG. 1, the numeral 10 designates the fluidized-bed-containing vessel, or reaction tube, in this case of Vycor, a heat resistant ceramic material. Surrounding vessel 10 are upper and lower heating coils 11$u$ and 11$l$, and upper and lower jacketing furnace enclosures 12$u$ and 12$l$, by means of which the required temperatures within vessel 10 are maintained. Heat measuring devices, such as thermocouples (not shown), are located at the top and bottom of tube 10.

Figure 1:
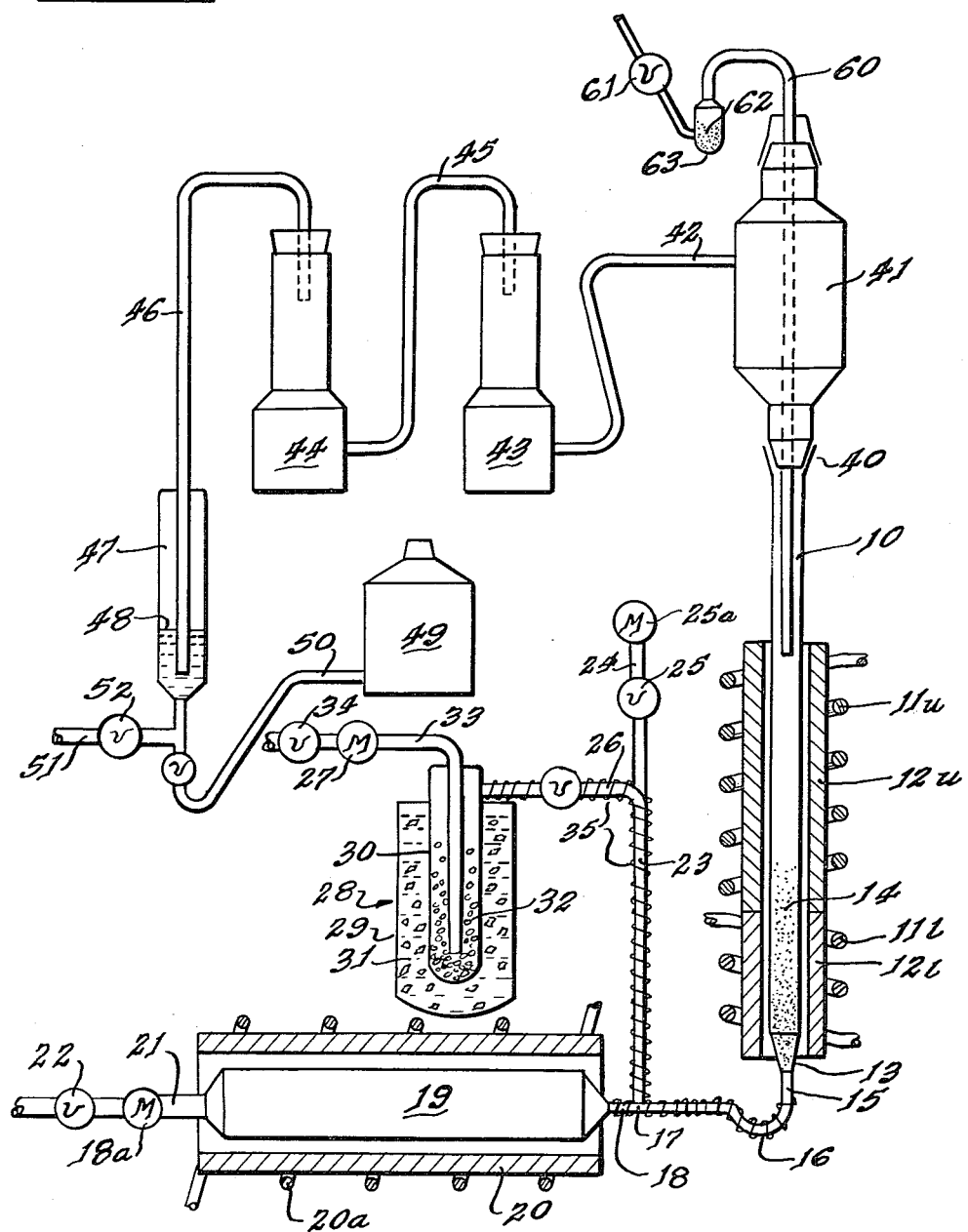
FIG. 1 of which is a schematic, partly sectional view of the apparatus used in carrying out the fluidized bed method of coating deposition.

At the lower end of vessel 10 is tapered portion 13, within which, and for some distance above, the fluidized bed of particles 14 is maintained in the manner shown.

Leading into the bottom of tapered portion 13 is inlet tube 15, also of Vycor, having a U-bend 16, and leading to junction 17. Leading into junction 17 is niobium pentachloride feed line 18 connecting with niobium pentachloride vaporizer 19.

Niobium pentachloride vaporizer 19 is provided with a jacketing furnace enclosure 20 having a heating means 20$a$. Leading into vaporizer 19 is carrier gas line 21, having control valve 22 and a flowmeter 18$a$, and leading to a carrier gas source (not shown). The preferred carrier gas is hydrogen. A heat measuring device such as a thermocouple (not shown) is in the vaporizer 19.

Also leading into junction 17 is combined fluidizing gas and carbon tetrachloride feed line 23, it being understood that the combined line could be two separate lines entering at different locations. Entering combined line 23 is fluidizing gas line 24, having a control valve 25 and leading to a fluidizing gas source (not shown) through meter 25$a$. The preferred fluidizing gas is normally hydrogen, although in certain cases when a very slow rate of deposition is desired an inert fluidizing gas such as helium, or a mixture of inert gas and hydrogen, could be used.

Also entering combined line 23 is carbon tetrachloride feed line 26, leading to carbon tetrachloride vaporizer shown generally at 28. Vaporizer 28 consists of an outer vessel 29 and an inner vessel 30; outer vessel 29 is highly heat insulative, in this case having vacuum insulation of the Dewar flask type. Outer vessel 29 contains cold producing material 31 such as a mixture of solid carbon dioxide (dry ice) and acetone, or ice and water. Inner vessel 30 is of glass and contains glass beads 32 which are surrounded by carbon tetrachloride, which will be either in the solid or liquid state, depending on whether cold producing material 31 is the dry ice and acetone mixture, or the water and ice mixture. Leading into inner vessel 30 and extending almost to the bottom is carrier gas line 33, having a control valve 34 and flowmeter 27, and leading to a carrier gas source (not shown). As in the case of the fluidizing gas the preferred carrier gas is hydrogen.

Preheater coil 35 preheats the gas in lines 26, 23, 18 and 15 prior to its entry into the fluidized bed 14.

At the upper end of fluidized-bed-containing vessel 10 is flared joint 40, gastightly connecting with particle disentraining vessel 41 in which the major portion of entrained dust from the fluidized bed 14 leaves the gas stream and falls back into the bed. The exhaust gas with the remaining entrained dust leaves vessel 41 by exhaust gas line 42 and passes through two dust traps 43 and 44 connected together in series by connecting line 45. Traps 43 and 44 are packed with any suitable packing material such as glass wool.

Leading out of dust trap 44 is cleaned-exhaust line 46, which leads into water bubbler 47 in which the water level 48 is maintained well above the bottom of line 46 by means of water from water reservoir 49, to which it is connected by reservoir line 50. The water absorbs the hydrogen chloride gas created by the reaction within the fluidized bed 14, and the remaining exhaust gas escapes through the top of bubbler 47. From time to time a sample of the water from bubbler 47 is withdrawn through sampling line 51, by opening sampling valve 52, line 50 being closed off so as not to drain reservoir 49, and the sample is titrated against a base such as NaOH to determine the course of the reaction.

Gastightly entering the top of disentraining vessel 41 is dual purpose line 60 which serves as a purge line for hydrogen or other purging gas before the main reaction within the fluidized bed 14. The second purpose of line 60 is to introduce into the fluidized bed 14 magnetically separable control spheres 62, such as spheres of nickel, of about the same particle size as the ceramic fuel particles being coated, from control sphere reservoir 63. When this is done the fluidizing gas and carrier gas flows are interrupted and a carrier gas flow from a source (not shown) is directed downward through the reservoir 63 through flexible line 60 and into the fluidized bed 14. This carries a quantity of control spheres 62 into bed 14; the function of control spheres 62 will be explained in more detail later on.

In carrying out the invention the particles to be coated may be either fissile or fertile, and any one of a number of ceramics, such as the oxides, carbide, nitrides and the like of the actinide metals uranium, plutonium and thorium. The actinide ceramics may be alone or admixed with other ceramics. One such admixture which we have found to be suitable is 29.5 w/o $ZrO_2$ and the balance $UO_2$. Metallic fuel or fertile particles could be used, but these have unfavorable growth characteristics under neutron irradiation, and hence ceramic particles are to be preferred.

The particle size of the particles to be coated may vary quite widely, but, in general, we prefer their average diameter to be within the range of from about 88 to about 177 microns, with essentially spherical shape and having a density of from about 80 to about 95 percent of the theoretical. Such particles are fine enough to be spoken of collectively as a powder.

In a reaction tube 10 having an inner diameter of about one inch, 100 grams of particles, or powder, is about the optimum charge. This is inserted into the tube 10 by opening the flared joint 40, after which the apparatus is purged with hydrogen, the valves 25 and 61 being open and valves 22 and 34 closed. After purging is complete it is preferable to raise the temperature of the tube 10 to about 850° C. while maintaining the flow of hydrogen through the bed 14 at a rate sufficient to keep it fluidized. This heating is preliminary to the main reaction and its purpose is to reduce higher oxide impurities of the ceramic particles, such as $U_3O_8$, to $UO_2$. The heating is accomplished by heating coil 11 and preheating coil 35, and should continue long enough to carry out the reduction mentioned; in the case of a 100 gram charge, about half an hour is sufficient for this.

Following the preliminary oxide reduction step the heating intensities of coils 11$u$, 11$l$ and 35 are reduced so that the temperatures may subside to the operating temperature range of the main reaction. This is from about 800° to about 900° C. within the fluidized bed 14, and substantially lower within the feed lines 18, 23 and 26. The latter should be kept safely below the decomposition or reduction temperatures at which solid reaction products would be deposited; otherwise pyrolysis will take place within the lines and undesirable deposits will build up to cause clogging.

Meanwhile the niobium pentachloride vaporizer 19 is charged with niobium pentachloride, and the heating means 20$a$ should be turned on to bring the vaporizer 19 within its operating temperature range. This is from about 149° to about 190° C., from 160° to 182° C. being preferred. The cooling material, dry ice and acetone, or water and ice, is inserted in outer vessel 29 of vaporizer 28 and the inner vessel 30 is charged with carbon tetrachloride.

Operation is started by closing valve 61 and opening valves 22, 27, and 34, thereby causing the carrier gases to sweep through vaporizers 28 and 19 and to carry the vapors of their respective charges into the reaction tube 10 where they enter the fluidized bed 14 of ceramic particles.

Within the bed 14 the $NbCl_5$ and $CCl_4$ are both pyrolyzed at the operating temperatures of 800° to 900° C., and metallic niobium will be deposited on the exterior of the ceramic particles to build up coatings, and simultaneously a minor amount of carbon will be deposited interstitially in the niobium coatings. The HCl produced by the hydrolysis of the $NbCl_5$, along with the unreacted fluidizing and carrier gases, will pass up through tube 10 to disentraining section 41 and out through tube 42 through dust traps 43 and 44, and thence through tube 46 into bubbler 47 where the water will dissolve the HCl. Samples of the water will be taken from time to time from sampling line 51 and titrated against a base, as already explained; this procedure is an accurate means of monitoring the progress of the reduction reaction within the fluidized bed 14 because the reaction produces hydrogen chloride on the one hand and metallic niobium and elemental carbon on the other in a perfectly stoichiometric relationship. The determination of the HCl is a dependable index to the amounts of niobium and carbon deposited on the particles except for minor amounts that are deposited on the walls of the tube 10.

One of the major problems in producing reliable coatings by vapor deposition in a fluidized bed has been that of impurities in the coatings. These can arise from two sources; from diffusion of species such as oxygen from the ceramic particle cores into the coatings, and from dust from the particles being deposited along with the coating materials. How our invention reduces impurities from both these sources will now be explained in order.

In order to reduce the first type of impurities a minor amount of magnetically separable control spheres are introduced at the start into the bed 14 along with the ceramic particles. These should be as close as possible to the particles in size so that they will be distributed uniformly throughout the bed and receive the same amount of coating. Because of the magnetic susceptibility of nickel and its chemical inertness control spheres of this metal are to be preferred.

After the reaction has been run and the particles coated to the desired depth, the charge is removed from the tube 10 and the coated control spheres are easily removed magnetically from the coated particles. The coatings on the control spheres and those on a sample of the particles are then chemically analyzed for the impurity in question.

Generally speaking, the more important impurities come, not from core diffusion, but from dusts of ceramic oxides, such as urania, which are codeposited with the niobium and carbon. To reduce these the reaction is run until enough of the desired coating has been deposited on the particles to suppress the further generation of dust within the bed. A coating having a thickness of about one micron is normally sufficient for this.

Carrier gas valves 22 and 34 may be then closed and the flow of fluidizing gas continued until dust previously generated within the bed 14 is swept out of tube 10 and into dust traps 43 and 44. Valve 61 is open and a small quantity of control spheres 62 are carried by a carrier gas out of reservoir 63 into tube 10 and bed 14. Control spheres 62 have been previously analyzed for the impurity in question such as oxygen.

Coating of the particles is then resumed in a second step; valve 61 is closed and valves 25, 22, and 34 are reopened and the reaction is continued until the particles are coated to the thickness desired, such as five to seven microns in a typical case. The charge is removed from the apparatus and the control spheres are removed magnetically from the particles and analyzed for the impurity is question; the difference between this analysis and the previous analysis of the spheres alone gives the impurity content of the coatings of the spheres. If this impurity content is found to be absent, or below tolerable limits, it is an assurance that this is also true of the outer layer of the coatings of the particles deposited in the second step. This is usually the important consideration since impurities in the inner layer do not significantly affect the mechanical strength or chemical characteristics of the coated particles. To be sure, it is theoretically possible to determine the impurity content of the outer part of the coatings by partially etching the particles themselves; however, this is difficult to carry out and does not give reliable results. Our control sphere method, on the other hand, is simple to operate and eliminates practically all possibility of error.

A refinement of the above control method is to use as controls, instead of bare nickel spheres 62, nickel spheres that have been previously coated with niobium to the same thickness as the particles prior to step 2.

The degree of hardness of the niobium coatings made by our process depends, of course, on the end use to which the coated particles are to be put. They may be used in loose bed reactors, or fabricated in matrices, with or without added matrix material. Methods of matrix fabrication vary widely; they can be made by roll bonding, pressing, swaging, sintering, casting and by combinations of these. Matrix material may be added before any of these operations; for example, particles coated according to the invention may be pressed together with niobium trichloride ($NbCl_3$) to produce the desired shape, and then the halide may be reduced to metal by heating in an atmosphere of hydrogen and sintering the product to a high density.

Figure 2:
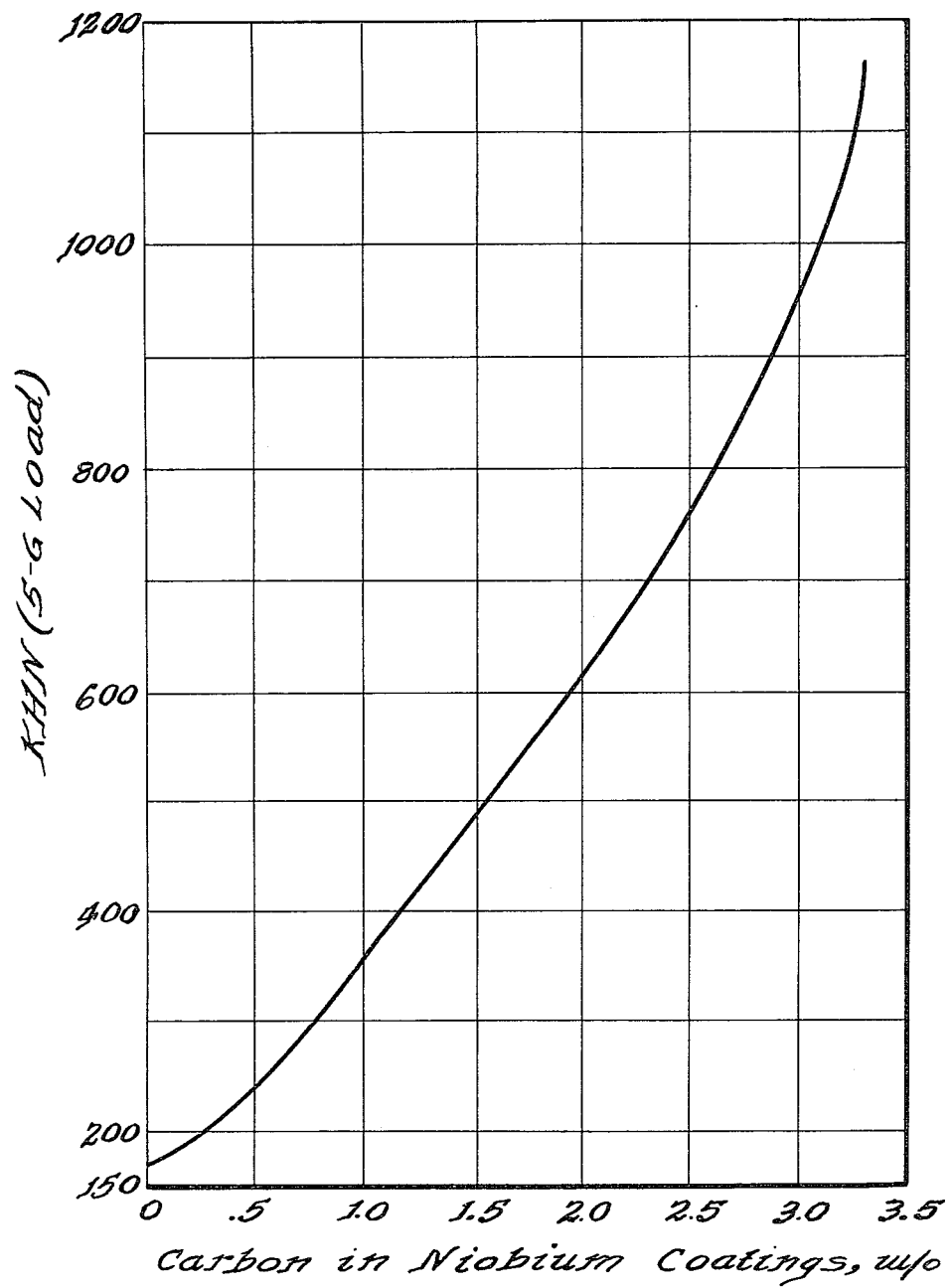
FIG. 2 is a graph in which Knoop hardness numbers (KHN) as ordinates are plotted against weight percentages of carbon in niobium coatings applied to ceramic fuel particles.

In any event, the degree of hardness desirable depends on the application to which the particles are to be put. There is a definite relationship, probably exponential, between carbon content and hardness, as can be seen from FIG. 2, the details of which were explained in the introduction to the drawings above. By means of this graph the carbon content needed to attain any desired degree of hardness may be readily obtained.

Figure 3:
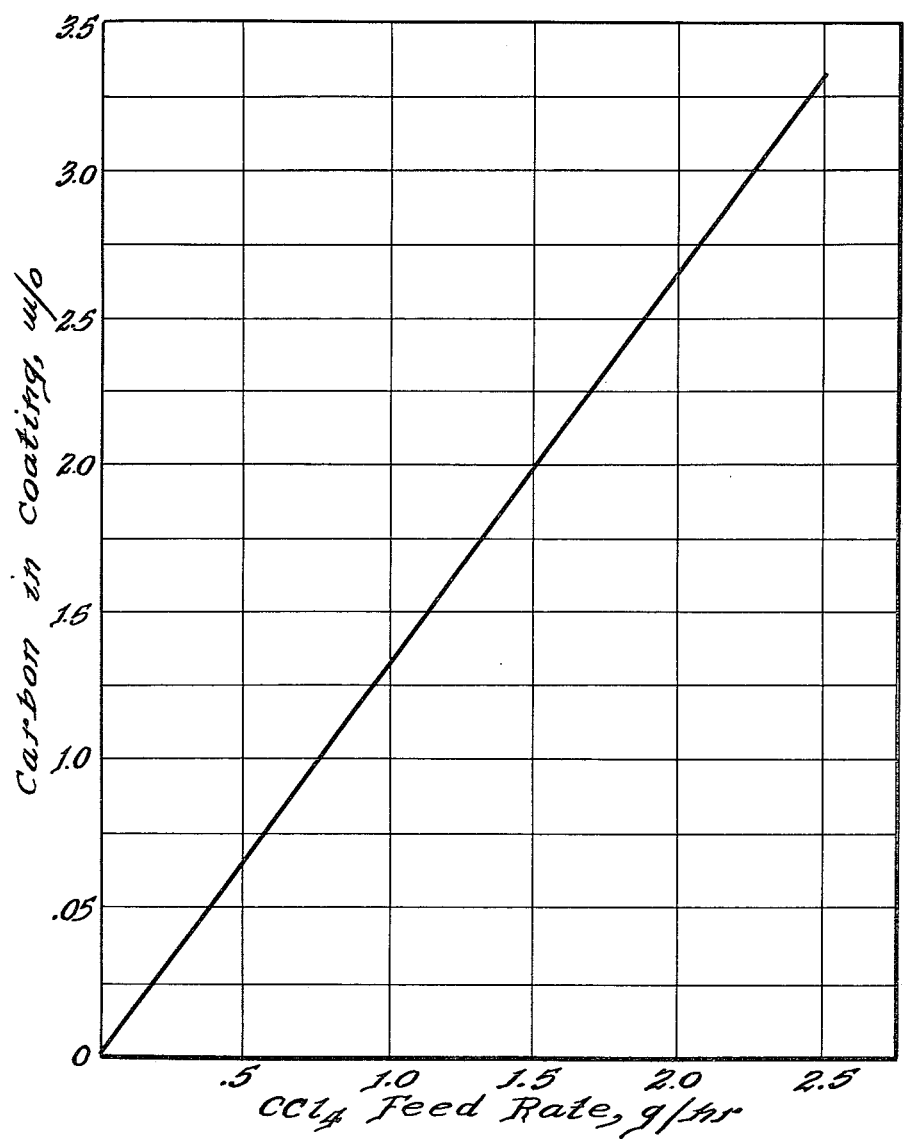
FIG. 3 is a graph in which weight percentages (abbreviated as w/o in this application) of carbon in niobium coatings, as ordinates, are plotted against $CCl_4$ feed rates in grams per hour as abscissae.

The target carbon content having thus been determined, the next step is to determine the feed rate of $CCl_4$ needed to produce it. This can be determined from the graph of FIG. 3, which was explained in the introduction to the drawings.

Figure 4:
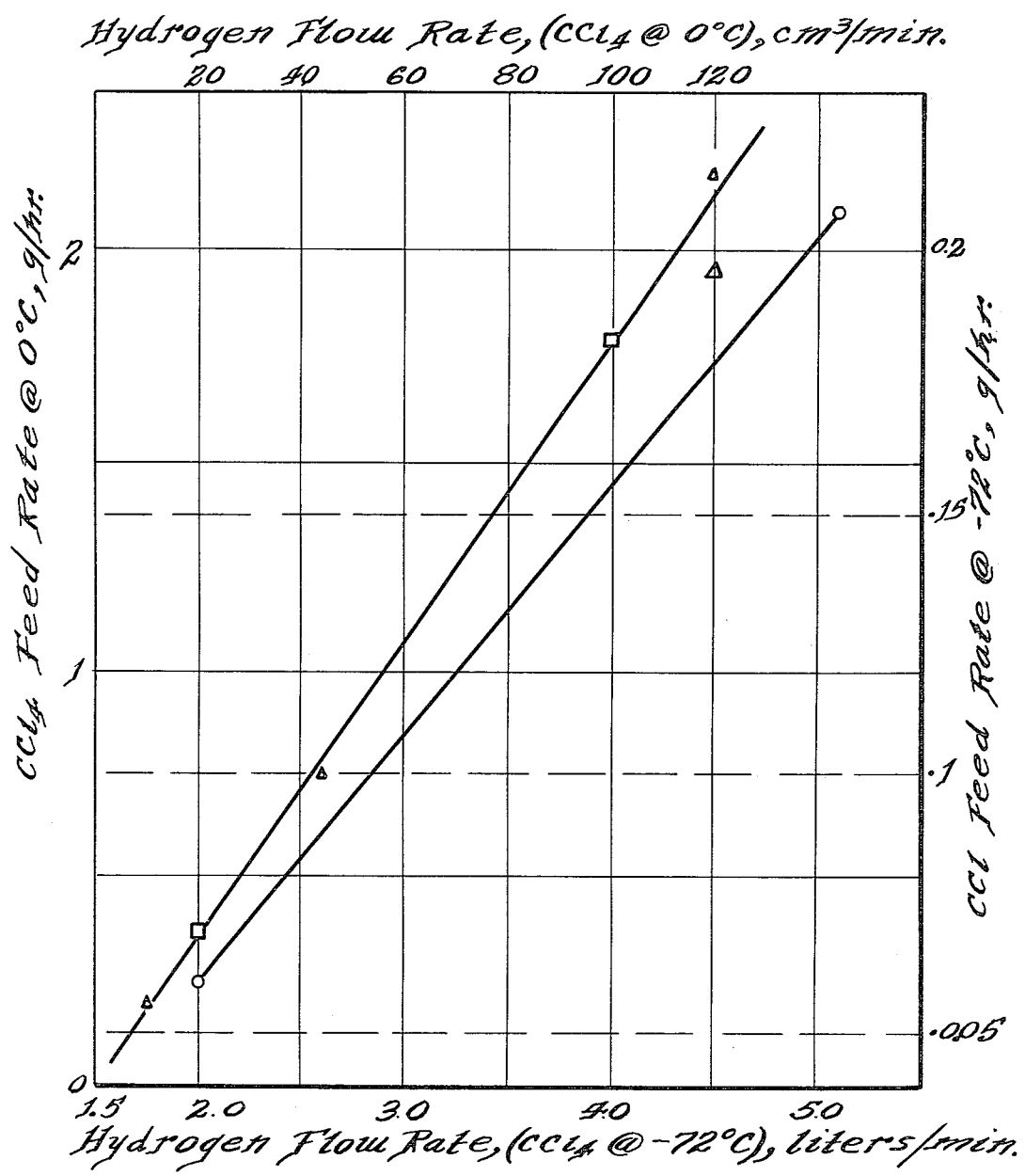
FIG. 4 is a graph in which carbon tetrachloride feed rates in grams per hour are plotted as ordinates against hydrogen flow rates as abscissae. This graph has two sets of ordinates, the set on the left referring to $CCl_4$ flow rates when its vaporizer is at zero degrees C., and the set on the right when it is at $-72°$ C. The graph also has two sets of abscissae; the top set of abscissae shows hydrogen flow rates in cubic centimeters per minute when the $CCl_4$ vaporizer is at zero degrees C.; and the bottom set, in liters per minute, when the $CCl_4$ vaporizer is $-72°$ C.

The feed rate of $CCl_4$ depends, in turn, on the rate of flow of the carrier gas through the vaporizer 28, and on the temperature of the vaporizer. The data showing this relationship is plotted in FIG. 4, as already explained in the introduction to the drawings. It will be noted, as stated in the legend, that the carrier gas used to compile the data was hydrogen but the same data would be substantially valid for other carrier gases, the only difference being any greater or lesser departure than hydrogen from ideal gas behavior. The upper curve on the graph was drawn between points that were calculated theoretically for the $CCl_4$ feed rate-carrier gas flow ratio with the $CCl_4$ vaporizer at 0° C.; it will be seen that this curve is in very good agreement with the measured ratio from actual tests under the same conditions, indicated by the triangles. The lower curve is based on measured data from actual tests when the vaporizer 28 was kept at −72° C. by a dry ice-acetone mixture.

The $NbCl_5$ feed rate, meanwhile, and the amount of niobium deposited on the particles is determined by titration of samples from the bubbler 47 as already explained. The rate of flow of carrier gas through vaporizer 19 is shown by meter 18a. The details of this can best be seen in the ensuing specific examples.

EXAMPLE I 100 grams of particles having the composition of 29.5 w/o $ZrO_2$ and the balance $UO_2$ and a particle size of −80 +100 mesh (U.S. Bureau of Standard Series, 1919) were coated according to the invention in an apparatus of the type shown in FIG. 1. The weight of the vaporizer 19 and its charge of $NbCl_5$ before the run was 1023.8 grams, and that of the vaporizer 28 with its charge of $CCl_4$ was 283.5 grams. The latter was kept at 0° C. by an ice-water mixture. The base used to titrate the samples from bubbler 47 was 3 M NaOH. The target carbon concentration in this run was 1 w/o.

In Table I below is a compilation of data from the run in which the particles were coated, the column on the left showing the time, the next column to the right the temperature of the top of the reaction tube 10, the next column its temperature at the bottom, and the next column the temperature of the NbCl5 vaporizer 19. The next three columns relate to flow rates, of the fluidized bed as shown by flow meter 25a, of carrier gas through NbCl5 vaporizer 19 as shown by flow meter 18a, and of carrier gas through CCl4 vaporizer 28 as shown by flow meter 27, in that order. The next two columns, or the first and second from the right, show the titration in milli-liters of 3 M NaOH, the column to the left shows the ml required at the time in the extreme left column, and the column to the right the running total of such ml from the start of the run.

Random samples of the coated particles were taken from the charge and subjected to Knoop hardness tests under a 5 gram load. The results of these tests, in Knoop Hardness Numbers (KHN) are set forth in Table II:

TABLE II

KHN
362
342
342
295
327
362
Average = 340

TABLE I

| | Temperature °C. | | | Flow cm³/min | | | Titration ml 3 M NaOH | |
|---|---|---|---|---|---|---|---|---|
| Time | Top Reaction Tube | Bottom Reaction Tube | NbCl5 Vaporizer | Flowmeter 25a | Flowmeter 18a | Flowmeter 27 | Sample | Total |
| 12:28 | 800 | 850 | | 4100 | 400 | 42 | — | — |
| 12:30 | 800 | 850 | 160 | 4100 | 400 | 42 | 9.0 | 9.0 |
| 12:45 | 800 | 850 | 161 | 4100 | 400 | 42 | 16.2 | 25.2 |
| 13:00 | 800 | 850 | 160 | 4100 | 400 | 42 | 14.0 | 39.2 |
| 13:15 | 800 | 850 | 160 | 4100 | 400 | 42 | 11.0 | 50.2 |
| 13:30 | 800 | 850 | 171 | 4100 | 400 | 42 | 12.2 | 62.4 |
| 13:45 | 800 | 850 | 168 | 4100 | 400 | 42 | 17.5 | 79.9 |
| 14:00 | 800 | 850 | 170 | 4100 | 400 | 42 | 16.5 | 96.4 |
| 14:15 | 800 | 850 | 177 | 4100 | 400 | 42 | 19.8 | 116.2 |
| 14:30 | 800 | 850 | 174 | 4100 | 400 | 42 | 23.8 | 140.0 |
| 14:45 | 800 | 850 | 174 | 4100 | 400 | 42 | 21.5 | 161.5 |
| 15:00 | 800 | 850 | 174 | 4100 | 400 | 42 | 21.4 | 182.9 |
| 15:15 | 800 | 850 | 174 | 4100 | 400 | 42 | 22.1 | 205.0 |
| 15:30 | 800 | 850 | 174 | 4100 | 400 | 42 | 21.5 | 226.5 |
| 15:45 | 800 | 850 | 174 | 4100 | 400 | 42 | 21.1 | 247.6 |
| 16:00 | 800 | 850 | 174 | 4100 | 400 | 42 | 21.5 | 269.1 |
| 16:15 | 800 | 850 | 174 | 4100 | 400 | 42 | 20.6 | 289.7 |
| 16:30 | 800 | 850 | 174 | 4100 | 400 | 42 | 21.0 | 310.7 |
| 16:45 | 800 | 850 | 174 | 4100 | 400 | 42 | 20.4 | 331.1 |
| 17:00 | 800 | 850 | 174 | 4100 | 400 | 42 | 21.8 | 352.9 |
| 17:15 | 800 | 850 | — | 4100 | 400 | 42 | 22.5 | 375.4 |
| 17:30 | 800 | 850 | — | 4100 | 400 | 42 | 21.5 | 396.9 |
| 17:45 | 800 | 850 | — | 4100 | 400 | 42 | 20.9 | 417.8 |
| 18:00 | 800 | 850 | — | 4100 | 400 | 42 | 20.0 | 437.8 |
| 6:15 | 800 | 850 | 174 | 4100 | 400 | 42 | 19.0 | 456.8 |
| 6:30 | 800 | 850 | 177 | 4100 | 400 | 42 | 18.6 | 475.4 |
| 6:45 | 820 | 850 | 177 | 4100 | 400 | 42 | 19.5 | 494.9 |
| 7:00 | 820 | 850 | 182 | 4100 | 400 | 42 | 23.4 | 518.3 |
| 7:15 | 800 | 850 | 182 | 4100 | 400 | 42 | 28.0 | 546.3 |
| 7:30 | 820 | 850 | 182 | 4100 | 400 | 42 | 24.5 | 570.8 |
| 7:45 | 800 | 850 | 182 | 4100 | 400 | 42 | 23.2 | 594.0 |
| 8:00 | 800 | 850 | 182 | 4100 | 400 | 42 | 22.0 | 616.0 |
| 8:15 | | Shutdown | | | | | 21.0 | 637.0 |

At the end of the runs, which totalled 7.5 hours, the charge of coated particles in the bed 14 was removed and the niobium foil deposited on the walls of reaction tube 10 was removed and weighed. It was found to weigh 1.3 grams. The coated particles were weighed and found to weigh 130.75 grams. The NbCl5 vaporized, as calculated from the titrations, was found to be 103.8 grams.

It was calculated that 5.6 grams of CCl4 were fed during the run and analysis showed the coatings to contain 0.935 w/o of carbon, or a departure of only 0.065 w/o from the target content of 1 w/o. The carbon deposition efficiency was 65.6%.

This data shows remarkable uniformity and greatly enhanced hardness as compared to particles coated according to prior methods.

EXAMPLE II

A second run was made with a target carbon content of 3 w/o. 100 grams of the same starting particles as in Example I were used. The initial weight of the vaporizer 19 and its charge of NbCl5 was 920 grams, and the initial weight of the vaporizer 28 and its charge of CCl4 was 337.6 grams. All other conditions were identical with those of Example I.

Table III below, compiled in the same way as Table I, shows the data on this run.

TABLE III

| | Temperature °C. | | | Flow cm³/min S.T.P. | | | Titration ml 3 M NaOH | |
|---|---|---|---|---|---|---|---|---|
| Time | Bottom Reaction Tube | Top Reaction Tube | NbCl5 Vaporizer | Flowmeter 25a | Flowmeter 18a | Flowmeter 27 | Sample | Total |
| 10:45 | 850 | 800 | 160 | 4100 | 400 | 122 | 6.0 | 6.0 |

TABLE III-continued

| Time | Temperature °C. Bottom Reaction Tube | Temperature °C. Top Reaction Tube | NbCl5 Vaporizer | Flow cm³/min S.T.P. Flowmeter 25a | Flow cm³/min S.T.P. Flowmeter 18a | Flow cm³/min S.T.P. Flowmeter 27 | Titration ml 3 M NaOH Sample | Titration ml 3 M NaOH Total |
|---|---|---|---|---|---|---|---|---|
| 11:00 | 850 | 800 | 160 | 4100 | 400 | 122 | 18.0 | 24.0 |
| 11:15 | 850 | 800 | 160 | 4100 | 400 | 122 | 22.2 | 46.2 |
| 11:30 | 850 | 800 | 160 | 4100 | 400 | 122 | 21.5 | 67.7 |
| 11:45 | 850 | 800 | 160 | 4100 | 400 | 122 | 20.6 | 88.3 |
| 12:00 | 850 | 800 | 160 | 4100 | 400 | 122 | 20.5 | 108.8 |
| 12:15 | 850 | 800 | 160 | 4100 | 400 | 122 | 20.8 | 129.6 |
| 12:30 | 850 | 800 | 160 | 4100 | 400 | 122 | 20.9 | 150.5 |
| 12:45 | 850 | 800 | 160 | 4100 | 400 | 122 | 21.0 | 171.5 |
| 1:00 | 850 | 800 | 160 | 4810 | 400 | 122 | 20.9 | 192.4 |
| 1:15 | 850 | 800 | 160 | 5150 | 400 | 122 | 20.0 | 212.9 |
| 1:30 | 850 | 800 | 160 | 5150 | 400 | 122 | 20.3 | 233.2 |
| 1:45 | 850 | 800 | 160 | 5150 | 400 | 122 | 19.7 | 252.9 |
| 2:00 | 850 | 800 | 160 | 5150 | 400 | 122 | 20.1 | 273.0 |
| 2:15 | 850 | 800 | 160 | 5150 | 400 | 122 | 18.0 | 291.0 |
| 2:30 | 850 | 800 | 160 | 5150 | 400 | 122 | 19.6 | 310.6 |
| 2:45 | 850 | 800 | 163 | 5150 | 400 | 122 | 19.0 | 379.6 |
| 3:00 | 850 | 800 | 166 | 5150 | 400 | 122 | 19.2 | 348.8 |
| 3:15 | 850 | 800 | 168 | 5150 | 400 | 122 | 20.5 | 369.3 |
| 3:30 | 850 | 800 | 168 | 5150 | 400 | 122 | 21.8 | 391.1 |
| 3:47 | 850 | 800 | 168 | 5150 | 400 | 122 | 24.0 | 414.1 |
| 4:00 | 850 | 800 | 168 | 5150 | 400 | 122 | 19.0 | 433.1 |
| 4:15 | 850 | 800 | 168 | 5150 | 400 | 122 | 21.6 | 454.7 |
| 4:30 | 850 | 800 | 168 | 5150 | 400 | 122 | 20.2 | 474.9 |
| 4:46 | 850 | 800 | 168 | 5150 | 400 | 122 | 21.6 | 496.5 |
| 5:00 | 850 | 800 | 168 | 5150 | 85 | 122 | 18.0 | 514.5 |
| 5:15 | 850 | 800 | 168 | 5150 | 85 | 122 | 19.8 | 534.3 |
| 5:30 | 850 | 800 | 168 | 5150 | 85 | 122 | 19.6 | 553.9 |
| 5:45 | 850 | 800 | 168 | 5150 | 85 | 122 | 19.5 | 573.4 |
| 6:00 | 850 | 800 | 168 | 5150 | 85 | 122 | 21.0 | 594.4 |
| 6:12 | Cut power on NbCl5 vaporizer | | | | | | | |
| 6:15 | | | | | | | 22.3 | 616.7 |
| 6:25 | Shut down | | | | | | 11.0 | 627.7 |

In this run, which totalled 7 hours, the weight of the niobium foil adhering to the reaction tube was 1.65 grams. The final weight of the charge was 125.2 grams, and the carbon content of the coatings 3.3 w/o. The Knoop Hardness Numbers under a 5 gram load are shown in Table IV.

TABLE IV

| KHN |
|---|
| 1276 |
| 1480 |
| 1480 |
| 1024 |
| 1024 |
| 1024 |
| 972 |
| 816 |
| 1080 |
| 1246 |
| 1246 |
| 1246 |
| 1177 |
| Average=1160 |

EXAMPLE III

A run similar to the runs in Examples I and II was made with a target carbon content in the coatings of 0.1 w/o. The charge consisted of 85 grams of the same particles used in the previous examples and 15 grams of nickel spheres of the same size, which had been pickled in dilute HCl and dried in argon. The initial weight of vaporizer 19 and its charge was 1116.0 grams and the cooling material in vaporizer 28 was a mixture of dry ice and acetone at −72° C. In all other respects the conditions were the same as in Example I. Data for this run appears in Table V below, which was compiled in the same way as Tables I and III except that the CCl4 and its carrier gas flow rate is in liters per minute.

TABLE V

| Time | Temperature °C. Bottom Reaction Tube | Temperature °C. Top Reaction Tube | NbCl5 Vaporizer | Flow liter/min S.T.P. Flowmeter 25a | Flow liter/min S.T.P. Flowmeter 18a | Flow liter/min S.T.P. Flowmeter 27 | Titration ml 3 M NaOH Sample | Titration ml 3 M NaOH Total |
|---|---|---|---|---|---|---|---|---|
| 9:50 | | | | | | | | |
| 10:20 | 850 | 800 | | | | | | |
| 10:45 | 850 | 800 | 149 | 3.40 | 0.40 | 1.84 | 2.3 | 2.3 |
| 11:00 | 850 | 800 | 160 | 3.40 | 0.40 | 1.84 | 7.6 | 9.9 |
| 11:15 | 850 | 800 | 160 | 3.40 | 0.40 | 1.84 | 15.7 | 25.6 |
| 11:17 | Added Ni spheres | | | | | | | |
| 11:30 | 850 | 800 | 160 | 3.40 | 0.40 | 1.84 | 19.0 | 44.6 |
| 11:45 | 850 | 820 | 160 | 3.40 | 0.40 | 1.84 | 15.0 | 59.6 |
| 12:00 | 850 | 800 | 160 | 3.40 | 0.40 | 1.84 | 20.0 | 79.6 |
| 12:15 | 850 | 800 | 163 | 3.40 | 0.40 | 1.84 | 18.5 | 98.1 |
| 12:30 | 850 | 800 | 163 | 3.40 | 0.40 | 1.84 | 16.2 | 114.3 |
| 12:45 | 850 | 800 | 166 | 3.40 | 0.40 | 1.84 | 18.2 | 132.5 |
| 1:00 | 850 | 800 | 166 | 3.40 | 0.40 | 1.84 | 19.0 | 151.5 |
| 1:15 | 850 | 800 | 171 | 3.40 | 0.40 | 1.84 | 17.1 | 168.6 |
| 1:30 | 850 | 800 | 174 | 3.40 | 0.40 | 1.84 | 16.8 | 185.4 |

TABLE V-continued

| | Temperature °C. | | | Flow liter/min S.T.P. | | | Titration | |
|---|---|---|---|---|---|---|---|---|
| | Bottom Reaction | Top Reaction | NbCl5 | Flowmeter | Flowmeter | Flowmeter | ml 3 M NaOH | |
| Time | Tube | Tube | Vaporizer | 25a | 18a | 27 | Sample | Total |
| 1:45 | 850 | 800 | 174 | 3.40 | 0.40 | 1.84 | 23.0 | 208.4 |
| 2:00 | 850 | 800 | 174 | 3.40 | 0.40 | 1.84 | 16.8 | 230.0 |
| 2:15 | 850 | 800 | 174 | 3.40 | 0.40 | 1.84 | 22.5 | 252.5 |
| 2:30 | 850 | 800 | 174 | 3.40 | 0.40 | 1.84 | 22.0 | 274.5 |
| 2:45 | 850 | 800 | 174 | 3.40 | 0.40 | 1.84 | 21.4 | 295.9 |
| 3:00 | 850 | 800 | 174 | 3.40 | 0.40 | 1.84 | 21.7 | 317.6 |
| 3:15 | 850 | 800 | 174 | 3.40 | 0.40 | 1.84 | 21.6 | 339.2 |
| 3:30 | 850 | 800 | 174 | 3.40 | 0.40 | 1.84 | 24.1 | 363.3 |
| 3:45 | 850 | 800 | 174 | 3.40 | 0.40 | 1.84 | 19.0 | 387.3 |
| 4:00 | 850 | 800 | 174 | 3.40 | 0.40 | 1.84 | 22.2 | 404.5 |
| 4:15 | 850 | 800 | 174 | 3.40 | 0.40 | 1.84 | 20.0 | 424.5 |
| 4:30 | 850 | 800 | 174 | 3.40 | 0.40 | 1.84 | 20.9 | 445.4 |
| 4:45 | 850 | 800 | 174 | 3.40 | 0.40 | 1.84 | 20.8 | 466.2 |
| 5:00 | 850 | 800 | 174 | 3.40 | 0.40 | 1.84 | 21.4 | 487.6 |
| 5:15 | 850 | 800 | 174 | 3.40 | 0.40 | 1.84 | 21.5 | 509.1 |
| 5:30 | 850 | 800 | 174 | 3.40 | 0.40 | 1.84 | 20.4 | 529.5 |
| 5:45 | 850 | 800 | 174 | 3.40 | 0.40 | 1.84 | 22.0 | 551.5 |
| 6:00 | 850 | 800 | 174 | 3.40 | 0.40 | 1.84 | 21.5 | 573.0 |
| 6:15 | 850 | | | | | | 21.3 | 594.3 |
| 6:30 | 850 | 800 | 138 | 3.40 | 0.40 | 1.84 | 15.5 | 609.8 |
| 6:45 | Off | | | | | | 6.0 | 615.8 |

The final charge, or bed, weight in this run was 128.25 grams. The coated nickel spheres were separated magnetically, weighed and found to weigh 17.5 grams. The remainder of the bed, or coated ceramic particles, weighed 110.7 grams. The weight of the niobium foil on the walls of the reaction tube was 3.1 grams. The weight of the NbCl4 vaporized was 110 grams, and the weight percent of carbon in the coatings was 0.144.

Table VI below gives the Knoop Hardness Numbers of a random sample of particles under the same load from this run:

TABLE VI

KHN
188
200
190
155
200
188
Average = 187

Throughout this application the abbreviation w/o is defined as weight percent based on the weight of the coatings, or based on the weight of the particles, as the sense requires.

It will be understood that the invention is not to be limited to the details given herein but that it may be modified within the scope of the appended claims.

What is claimed is:

1. A method of coating particles of $ZrO_2$-$UO_2$ mixtures with hardened niobium, comprising placing the particles in a fluidized bed, maintaining the temperatures of the bed at from about 800° C. to about 900° C., leading niobium pentachloride vapor and carbon tetrachloride vapor into the bed, whereby niobium metal is deposited as a coating on the particles and carbon is deposited interstitially within the niobium.

2. The method of claim 1 where the bed is fluidized by hydrogen.

3. The method of claim 1 where the particles have the composition of about 29.5 w/o $ZrO_2$ and the balance $UO_2$.

4. A method of coating ceramic nuclear fuel particles containing a major amount of an actinide ceramic, comprising admixing with the particles a smaller quantity of magnetically separable control spheres of about the same size as the particles, placing the admixture so made within a bed fluidized by hydrogen, maintaining the temperature of the bed at from about 800° C. to about 900° C., leading niobium pentachloride vapor and carbon tetrachloride vapors into the bed, whereby niobium metal is deposited on the particles and on the control spheres and carbon is deposited interstitially within the niobium metal, removing the particles and spheres from the bed, separating the control spheres magnetically from the particles, analyzing the coatings on the control spheres and on a sample of the particles for impurities, and comparing the analysis so obtained for impurity content.

5. The method of claim 4 where the control spheres are of nickel.

6. The method of claim 4 where the actinide ceramic is $UO_2$ and the impurity analyzed and compared is an element other than oxygen, zirconium and uranium.

7. A method of coating ceramic nuclear particles containing a major amount of an actinide ceramic, comprising analyzing a sample of magnetically separable control spheres for impurity species, placing the particles in a fluidized bed, maintaining the temperature of the bed at from about 800° C. to about 900° C., leading niobium pentachloride and carbon tetrachloride vapors into the bed for a sufficient time to coat the particles partially, and to a depth sufficient to prevent further generation of dustiness within the bed, purging the bed of dustiness, adding to the bed a minor quantity of the control spheres, leading niobium pentachloride and carbon tetrachloride vapors into the bed a second time and sufficient to complete coating of the particles, removing the particles and control spheres from the bed, separating the control spheres magnetically from the particles, and analyzing the control spheres and their coatings for impurities.

8. The method of claim 7 where the control spheres are of nickel.

9. The method of claim 7 where the control spheres are of nickel coated with a coating comprising a major amount of niobium metal.

10. An apparatus for coating particles with hardened metal comprising a reaction tube, heating means closely associated with the reaction tube, fluidizing gas conduction means leading into the bottom of the reaction tube, a metal chloride vaporizer, heating means closely associated with said vaporizer, means for leading carrier gas into said vaporizer, means for leading carrier gas and entrained metal halide vapor out of said vaporizer and into the bottom of said reaction tube, a carbon tetrachloride vaporizer having an inner vessel and an outer vessel, cooling material within the outer vessel and without the inner vessel, means for leading carrier gas into the inner vessel, means for leading carrier gas and entrained carbon tetrachloride vapor out of said vaporizer and into the bottom of said reaction tube, a dust disentraining vessel above and in gas-tight communication with the reaction tube, means for leading exhaust gases out of said disentraining vessel, means for entrapping dust in said exhaust gases, means for thereafter passing said exhaust gases through water, means for taking periodic samples from said water, means for replacing the volume of water so taken for samples, purging gas exit means at the top of said disentraining vessel, a control sphere reservoir in communication with said reaction tube, magnetically separable control spheres within the reservoir, and means for conveying control spheres from the reservoir into the reaction tube.

* * * * *